United States Patent [19]

Petrellis et al.

[11] 4,316,949

[45] Feb. 23, 1982

[54] PHOTOREACTIVE OLIGOMER COMPOSITION AND PRINTING PLATE

[75] Inventors: Pano C. Petrellis, Lake Elmo; Larry A. Lien, Forest Lake; Wesley E. Zarr, Lake Elmo, all of Minn.

[73] Assignee: Minnesota Mining and Manufacturing Company, St. Paul, Minn.

[21] Appl. No.: 103,712

[22] Filed: Dec. 14, 1979

[51] Int. Cl.$^3$ .......................... G03C 1/76; G03C 1/52
[52] U.S. Cl. .................................... 430/159; 430/175; 430/177; 430/156; 430/160; 430/162; 430/176
[58] Field of Search .............. 430/175, 177, 156, 159, 430/160, 162, 281, 176

[56] References Cited

U.S. PATENT DOCUMENTS

| | | | |
|---|---|---|---|
| 3,954,475 | 5/1976 | Bonham | 430/281 |
| 4,104,072 | 8/1978 | Golda et al. | 430/175 |

FOREIGN PATENT DOCUMENTS

| | | | |
|---|---|---|---|
| 1463818 | 2/1977 | United Kingdom | 430/176 |
| 1482953 | 8/1977 | United Kingdom | 430/281 |

*Primary Examiner*—Won H. Louie, Jr.
*Attorney, Agent, or Firm*—Cruzan Alexander; Donald M. Sell; Mark A. Litman

[57] ABSTRACT

A long running printing press can be obtained by use of a photopolymerizable composition comprised of an ethylenically unsaturated oligomer, a solvent soluble diazonium resin, an organic film forming binder, and a photoinitiator system in described ratios.

13 Claims, No Drawings

PHOTOREACTIVE OLIGOMER COMPOSITION AND PRINTING PLATE

BACKGROUND OF THE INVENTION

Coating compositions with a variety of different chemical and physical properties are known. Different areas of ultimate use may require either drastic or subtle differences in these properties.

In the lithographic printing plate technology, photoreactive compositions are sought which have desirable properties and which are substantially different before and after they are reacted. For example, when a photoreactive composition is on a light sensitive lithographic plate, it should be stable (i.e., not subject to separation of diverse components), resistant to mild contact (i.e., not tacky so as to prevent loss of composition when the reactive surface contacts other materials), and storage stable (i.e., not change its reactivity by losing components through evaporation), yet also being capable of fast curing and easy development (i.e., removed) by solvents when not cured. The cured composition must on the other hand be tough, resistant to solvents, and oleophilic. These are difficult properties to combine in the compositions which are required in the lithographic printing art. Where extreme properties are required, such as sufficient strength and durability in the cured film to provide accurate copies on press for in excess of half a million copies, the difficulty in finding compositions which meet these requirements is multiplied.

In the lithographic printing art, the standard for high quality, long run printing plates is the bimetallic printing plate. This plate is composed entirely of metal to provide a longlasting printing plate. The most significant problem with the plate is that it cannot be formed quickly by exposure and wash development, but must rather be prepared by a much slower and expensive etching process.

It is a consideration of the present invention to provide a photoreactive, developable composition for use on printing plates to provide plates having press lives which approach that of bimetallic plates.

SUMMARY OF THE INVENTION

A photoreactive composition for application to substrates according to the present invention comprises an organic solvent soluble oligomeric diazonium resin, an oligomer having a plurality of acrylate groups, an organic binder resin, and a photoinitiator system.

The compositions when applied to a substrate are non-tacky, stable (i.e., the ingredients are compatible and do not readily separate on standing), fast curing, and readily developable. The cured composition has a high degree of crosslinking and provides a lithographic printing plate with the potential for a long life on press.

DETAILED DESCRIPTION OF THE INVENTION

The compositions of the present invention generally comprise, exclusive of solvents, 10–50% by weight of organic polymeric binder, 30–75% by weight of oligomer and 0.1 to 10% by weight of organic solvent soluble photosensitive oligomeric diazonium salt. A preferred range of ingredients is comprised of 20–40% binder, 45–65% oligomer and 1–5% diazonium resin.

Other materials may, of course, be present in the compositions such as surfactants, antistatic agents, dyes, pigments, and, of course, copolymerizable monomeric or other oligomeric units. These materials may be present in various weight percentages, but it is particularly desirable to maintain the ratio of monomer to oligomer at less than or equal to equal proportions. Most preferably, it is desirable to keep the ratio equal to or less than one to four (monomer/oligomer). The benefit of this proportion is in keeping the percentage of low molecular weight monomeric materials to a minimum so as to reduce the volatility of the components and prevent tackiness on the surface of the coated composition. It has been surprisingly found that even with most preferred compositions comprising 20–40% binder, 50–60% oligomer and 2–4% diazonium resin, that fast curing, highly crosslinkable compositions can be provided with no monomeric ingredients or relatively low amounts of monomeric ingredients.

The compositions of the present invention may be used on a variety of substrates as is known in the art. Polymeric substrates are useful, but aluminum and other metal substrates are the most desirable in the art.

The construction of the support for the preferred embodiments of the compositions may vary, as is well known in the art, but generally aluminum base sheets are used with the photopolymerizable composition coated on at least one side thereof. The properties and construction of the aluminum sheet is an art unto itself, with many known variations in the sheet being practiced by the skilled artisan. Such variations include smooth aluminum sheets, mechanical and chemical graining, chemical and electrochemical etching, anodizing, silicating, passivating, and combinations of one or more of each of these treatments. A brief discussion of these treatments would be useful in understanding certain aspects of the practice of the present invention, and particular in understanding the complexity of the technology.

Graining of the aluminum surface is usually performed to improve the adherence of the photopolymerizable composition and the exposed and developed composition to the image of the plate. This can be done mechanically (e.g., brush or slurry graining), chemically, or electrically. Electrochemical etching or graining of aluminum substrates also improves the adherence of coatings to the surface of the sheet. This process is disclosed in the art, for example, in U.S. Pat. Nos. 3,330,743; 3,073,765; 3,891,516; 3,963,594; and 4,072,589 and British Pat. No. 1,544,315. These patents teach variations in the electrolytic solutions, conditions, and related treatments to provide specific additional properties in the aluminum plate. Anodizing provides an aluminum oxide surface on the plate which usually provides a harder and more abrasion resistant surface on the aluminum plate. Exemplary anodizing processes are disclosed in U.S. Pat. Nos. 3,181,461 and 3,280,734 where aluminum plates are first anodized and then treated with an alkali metal silicate. This produces a plate which is both highly hydrophilic and oleophobic, and which exhibits good abrasion resistance and scratch resistance.

All of these types of plates may find utility in the practice of the present invention, but it is preferred to have grained, anodized and silicated plates. It is more preferred to have grained, electrochemically etched, anodized, and silicated plates, particularly where there has been mechanical graining.

In addition to selecting the particular plate substrate, other techniques such as the application of a diazo resin (i.e., the condensation product of an aromatic diazonium salt and an aldehyde, e.g., formaldehyde) to the surface of the plate, as originally taught in U.S. Pat. No. 2,714,066 are also desirable. These diazo resins may be water and/or organic solvent soluble, and assist in the developability of the printing plate, i.e., the ability of the composition to be removed from the plate where not struck by light.

The organic polymeric binder component of the present composition may be selected from amongst all those known in the art such as poly(vinylbutyral), poly(vinylformal) and other polyvinyl acetals, cellulose acetate butyrate (or propionate), poly(vinylacetate), and the like. The preferred binders are oleophilic resins. A most preferred class of binders includes oleophilic resins having pendant or terminal acrylate (including methacrylate) groups which can participate in the photoinitiated curing reaction of the composition such as acrylated poly(vinylformal), acrylated poly(vinylbutyral) and other acrylated hydroxy substituted polymers. They may be formed in any of a number of different reaction mechanisms which can be summarized as follows. A polymer is selected having reactive sites (e.g., —OH, —COOH, azlactone groups, amine groups, etc.) thereon. A compound is selected having an acrylate group (or a multiplicity of acrylate groups) on one side and a group reactable with the reactive site on the other side. Upon reaction of this last ambifunctional compound with the polymer, a polymer having pendant acrylate groups is generated. Examples of such ambifunctional compounds are acids, acid chlorides, and isocyanates with the desirable unsaturated functionality, e.g. acrylic acid, acrylonyl chloride, isocyanate ethyl methacrylate.

The free-radical photoinitiator systems of the present invention are generally known. They are compounds which absorb radiation, generally actinic radiation, and are activated to become agents which abstract hydrogens from hydrogen donors. There may also be or may need to be sensitizers present to enable the compounds to be photoactivated. Examples of these materials are the benzoins, acetophenones, naphthoquinones and benzophenones (as disclosed in British Pat. No. 1,482,953), vinyl substituted halomethyl-s-triazine compunds (as disclosed in U.S. Pat. No. 3,954,475), and aromatic onium compounds (as disclosed in U.S. Pat. Nos. 4,059,400; and 4,058,401, but with any anion). Other desirable photoinitiator systems are generally known in the prior art such as in U.S. Pat. Nos. 3,775,113; 3,887,450; 3,895,949; and 4,043,819. The photoinitiator systems are generally useful as 0.5–15% by weight of active ingredients in the printing composition. preferably they are present as 1–6% by weight of the composition. When needed, spectral sensitizers are usually included at a level of about 10 to 70% by weight of the photoinitiator.

The solvent soluble oligomeric diazonium resin component is also well known in the art. These diazo resins are condensation products of diazonium salts and aldehydes, preferably formaldehyde. The formation of these salts is well known in the art and was first taught for use with printing plate compositions in U.S. Pat. No. 2,714,066.

The photopolymerizable oligomers of the present invention comprise a hydrocarbon backbone having bonded thereto at least one acrylate (including methacrylate) group, with a polycarbamate group bridging the backbone and the acrylate. These oligomers may be represented by the formula:

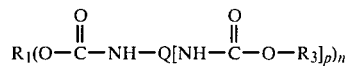

wherein $R_1$ is the residue of an organic alcohol or a polyol having n hydroxyl groups removed therefrom, $R_3$ is an acryloyl or methacryloyl containing group, Q is the residue of a polyisocyanate having $p+1$ isocyanate groups removed therefrom, p is a positive whole integer, and n is a positive whole integer of at least 2, and where the total number of acryloyl or methacryloyl groups is at least 5.

$R_1$ may be formed from any hydroxy containing organic alcohol or organic polyol. For example, $R_1$ may be formed by removing (i.e., reacting with isocyanate groups) hydroxyl groups from 2-ethyl hexanol, 2,2-dimethyl-3-hydroxy-propyl-2',2'-dimethyl-3-hydroxy propionate, 2-ethyl-2-hydroxymethyl-1,3-propanediol, poly(vinylformal), poly(vinylbutyral), and even a hydroxylated photopolymerizable acrylate or methacrylate such as Epocryl®12 (DuPont) or Nupol® (Freeman). Polyolefin polyols, polydiene polyols, polylactone polyols, polyester polyols, polyether polyols, and polysiloxane polyols are also useful.

$R_3$ is the residue of an hydroxy-containing acryloyl or methacryloyl group and includes residues of polyacryloyl-containing and polymethacryloyl-containing moieties, the residue formed by removal of a hydroxyl group. The residues would be formed by elimination of hydroxyl groups from hydroxy substituted mono-, di-, tri-, or polyacrylates or methacrylates such as hydroxyl ethyl methacrylate (HEMA), and pentaerythritol triacrylate (PETA).

Q is the residue formed by the removal of isocyanate (—N=C=O) groups from a di- or polyisocyanate. For example, if the diisocyanate were 2,4-tolylene diisocyanate,

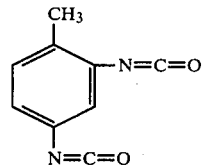

the residue would be

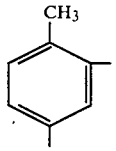

Aliphatic, aromatic, heterocyclic, and mixed (i.e., combinations of aliphatic and aromatic or aliphatic and heterocyclic) isocyanates are useful.

It has been found that lower acrylate equivalent weights (i.e., the molecular weight of the oligomer divided by the number of acrylate groups thereon) are desired in the oligomers. For example, the oligomer of Example 2 has a degree of unsaturation expressed as 190 g/equivalent. A preferred range for such a degree of unsaturation is between 150 and 600. It is more preferred to have between 160 and 500 as the degree of unsaturation.

The compositions of the present invention may be applied to the selected substrate from solution, as in 2 to 50% by weight solutions in conventional solvents such as ethylene dichloride, methylethyl ketone, methylisobutyl ketone, tetrahydrofuran, etc. Compositions of this invention, as noted above, are particularly outstanding in that they are highly reactive, stable, and clean out relatively easily. The cured composition on the most preferred substrate described above provides an extremely long lived plate. A composition identical to that of Example 2 on a mechanically grained, electrochemically etched, anodized and silicated aluminum sheet provided over 1,000,000 quality copies without failure. This compares favorably with the bimetallic plates used commercially.

These and other aspects of the present invention will be further described in the following examples. All percentages are with respect to weight and all parts are with respect to molar ratios, unless otherwise stated.

EXAMPLE 1

An isocyanate endcapped intermediate was formed by adding 102 parts of a diol of the formula:

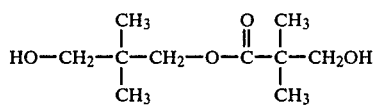

as a 50% solution in ethylene dichloride, to a 50% solution in ethylene dichloride of 174 parts of 2,4-tolylene diisocyanate. The solution was continuously stirred at room temperature and the reaction was allowed to proceed for two hours. To the above intermediate, pentacrythritol triacrylate was added with stirring while the flask temperature was maintained at or below 30° C. Addition was completed in a few minutes and the reaction was allowed to exotherm (60°–65° C.). After the initial exotherm, catalyst (dibutyl tin dilaurate) was added and the reaction mixture heated to 65°–75° C. for a period of one hour or until the complete disappearance of the isocyanate functionality.

The PETA was added in a molar ratio of about 1.7/1 in a relationship to the intermediate. The resulting product was believed to have the structural formula

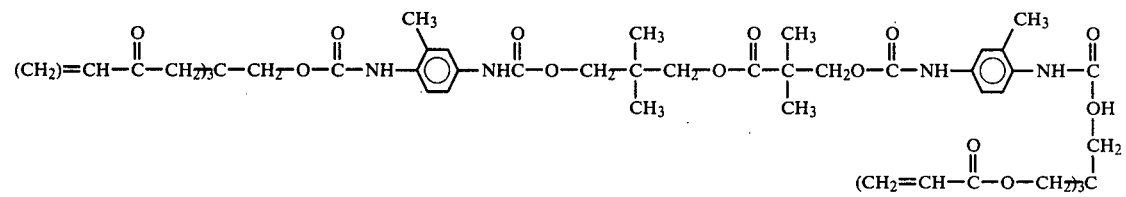

EXAMPLE 2

A photosensitive composition suitable for use on a lithographic printing plate was formulated by mixing the following ingredients in the indicated parts by weight:

| Component | Parts |
| --- | --- |
| poly(vinylformal) | 10.2 |
| poly(vinylbutyral) | 5.1 |
| oligomer (of Example 1) | 24.3 |
| a blue pigment (phthalocyanine) | 1.7 |
| 2-(p-methoxystyryl)-4,6-bis(trichloromethyl)-s-triazine(a photoinitiator) | 0.883 |
| triisopropylnaphthalene sulfonic acid salt of the condensation product of paraformaldehyde and p-diazodiphenylamine | 1.77 |
| oxalic acid | 0.088 |
| Oil Yellow(dye) | 0.132 |
| ethylene dichloride | 212. |
| methylethyl ketone | 15.8 |

A silicated aluminum surface was prepared for coating by the application of a 2% aqueous solution of the zinc chloride half salt of the condensation product of paraformaldehyde and p-diazo-diphenylamine. The treated aluminum substrate was then coated with the light sensitive solution at a coating weight of about 200±10 mg/ft$^2$ with a three roll coater. Drying at 70°–80° C. for 2–3 minutes produced a continuous blue-green film of the photopolymer layer.

The resulting photopolymer lithographic plate was then exposed through a half-tone negative on a commercial ultraviolet light emitting camera. A visible image, caused by the conversion of the yellow form of the dye into its colored (red form, was obtained after exposure. The plate was then developed in a developing solution comprising 37% n-propanol, 60% water, 1.5% ammonium sulfite, and 1.5% ammonium dihydrogen phosphate. The non-exposed areas of the plate were removed with light scrubbing to give a developed plate.

The plate displayed excellent press life and good ink pickup in use on press.

What we claim is:

1. A negative acting lithographic printing plate comprising an aluminum substrate having at least one surface thereof silicated and coated with an oligomeric diazonium resin and having coated on said diazonium resin a photoreactive composition comprising:

(a) 30–75% by weight of an oligomer of the formula

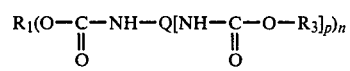

wherein $R_1$ is the residue of an organic alcohol or a polyol having n hydroxyl groups removed therefrom, $R_3$ is an acryloyl or methacryloyl containing group, Q is the residue of a polyisocyanate having p+1 isocyanate groups removed therefrom, p is a positive whole integer, n is a positive whole integer of at least 2, and n and p are such that the oligomer has at least 5 acryloyl or methacryloyl groups, (b) 10–50% by weight of an organic polymeric binder, (c) 0.1 to 10% by weight of an organic solvent soluble photosensitive oligomeric diazonium resin, and (d) an effective amount of a free radical photoinitiator system.

2. The plate of claim 1 wherein said oligomeric diazonium resin is a water soluble diazonium resin.

3. The plate of claim 2 wherein p is 1, 2, or 3.

4. The plate of claim 2 wherein said water soluble oligomeric diazonium resin and said organic solvent soluble oligomeric resin are each different condensation products of diazonium salts and aldehydes.

5. The plate of claim 4 wherein said aluminum substrate is grained.

6. The plate of claim 1 wherein said substrate is grained and etched aluminum.

7. The plate of claim 2 wherein said aluminum substrate is grained, etched, and anodized.

8. The plate of claim 2 wherein said aluminum substrate is mechanically grained, electrochemically etched, anodized, and silicated.

9. The plate of claim 3 wherein $R^3$ is an acryloyl containing group.

10. The plate of claim 9 wherein Q is the residue of an aromatic diisocyanate.

11. The plate of claim 9 wherein said organic polymeric binder comprises a polyvinylacetal.

12. The plate of claim 9 wherein said organic polymeric binder is an acrylated hydroxy substituted polymer.

13. The plate of claim 9 wherein $R^1$ is the residue formed by removing hydroxyl groups from materials selected from the group consisting of 2-ethyl hexanol, 2,2-dimethyl-3-hydroxypropyl-2',2'-dimethyl-3-hydroxy propionate, 2-ethyl-2-hydroxymethyl-1,3-propanediol, poly(vinylformal), and poly(vinylbutyral).

* * * * *